United States Patent
Sugawara et al.

(10) Patent No.: US 12,247,104 B2
(45) Date of Patent: Mar. 11, 2025

(54) POLYAMIC ACID RESIN, POLYIMIDE RESIN, AND RESIN COMPOSITION INCLUDING THESE

(71) Applicant: Nippon Kayaku Kabushiki Kaisha, Tokyo (JP)

(72) Inventors: Kenta Sugawara, Tokyo (JP); Ryutaro Tanaka, Tokyo (JP); Shigeo Hayashimoto, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 615 days.

(21) Appl. No.: 17/437,894

(22) PCT Filed: Mar. 7, 2020

(86) PCT No.: PCT/JP2020/009894
§ 371 (c)(1),
(2) Date: Sep. 10, 2021

(87) PCT Pub. No.: WO2020/189354
PCT Pub. Date: Sep. 24, 2020

(65) Prior Publication Data
US 2022/0169791 A1    Jun. 2, 2022

(30) Foreign Application Priority Data
Mar. 15, 2019  (JP) ................................. 2019-047862

(51) Int. Cl.
*C08G 73/10* (2006.01)
*C08L 79/08* (2006.01)

(52) U.S. Cl.
CPC ......... *C08G 73/1067* (2013.01); *C08G 73/10* (2013.01); *C08G 73/1042* (2013.01); *C08L 79/08* (2013.01)

(58) Field of Classification Search
CPC ..... C08G 73/1042; C08G 73/10; C08L 79/08; C08J 5/18
See application file for complete search history.

(56) References Cited

U.S. PATENT DOCUMENTS

| | | | |
|---|---|---|---|
| 2008/0146692 A1 | 6/2008 | Uehara et al. | |
| 2009/0202831 A1* | 8/2009 | Honda | C08G 73/1071 528/289 |
| 2009/0286087 A1 | 11/2009 | Tanaka et al. | |
| 2016/0009862 A1 | 1/2016 | Jeon et al. | |

FOREIGN PATENT DOCUMENTS

| | | | | |
|---|---|---|---|---|
| CN | 101068852 | A | | 11/2007 |
| CN | 101291990 | A | | 10/2008 |
| CN | 102186904 | A | | 9/2011 |
| CN | 104760368 | A | | 7/2015 |
| CN | 108780275 | A | | 11/2018 |
| JP | 2001261825 | A | * | 9/2001 |
| JP | 2008094927 | A | | 4/2008 |
| JP | 2013083958 | A | * | 5/2013 |
| JP | 2015117278 | A | | 6/2015 |
| JP | 2016127429 | A | | 7/2016 |
| JP | 2016192530 | A | * | 11/2016 |
| JP | 2017095566 | A | | 6/2017 |
| JP | 2018168369 | A | | 11/2018 |
| JP | 201939096 | A | | 3/2019 |
| WO | 2010047271 | A1 | | 4/2010 |
| WO | WO-2016171101 | A1 | * | 10/2016 |
| WO | 2017170032 | A1 | | 5/2017 |
| WO | WO-2017217292 | A1 | * | 12/2017 ............. C08G 73/10 |

OTHER PUBLICATIONS

Office Action issued in CN2022042901604250 on May 7, 2022.

* cited by examiner

*Primary Examiner* — Gregory Listvoyb
(74) *Attorney, Agent, or Firm* — The Webb Law Firm

(57) ABSTRACT

The purpose of the present invention is to provide: a resin material that has a novel structure and can be suitably used in a printed wiring board: and a resin composition that contains this resin material and has a cured product thereof having a low dielectric loss tangent and excellent adhesion, heat resistance, and mechanical characteristics. The present invention provides: a polyamic acid resin that is a reaction product of an amino phenol compound (a), an aliphatic diamino compound (b), a tetrabasic acid dianhydride (c), and an aromatic diamino compound (d), said polyamic acid resin having an amino group at both ends thereof: a polyimide resin being an imidization compound of the polyamic acid resin: a resin composition containing the polyimide resin: and a cured product thereof.

11 Claims, No Drawings

POLYAMIC ACID RESIN, POLYIMIDE RESIN, AND RESIN COMPOSITION INCLUDING THESE

CROSS-REFERENCE TO RELATED APPLICATIONS

This application is the United States national phase of International Application No. PCT/JP2020/009894 filed Mar. 7, 2020, and claims priority to Japanese Patent Application No. 2019-047862 filed Mar. 15, 2019, the disclosures of which are hereby incorporated by reference in their entirety.

BACKGROUND OF THE INVENTION

Field of the Invention

The present invention relates to a polyamic acid resin having a novel structure, a polyimide resin which is an imidization compound of the polyamic acid resin, a resin composition containing these resins and a cured product of the resin composition.

Description of Related Art

As an essential part for a mobile communication device such as a smartphone and a tablet computer, a communication base station apparatus and an electronic device such as a computer and a car navigation device, a printed wiring board is used. Many resin materials excellent in the characteristics such as adhesion to a metal foil, heat resistance and flexibility are used for the printed wiring board.

Recently the printed wiring board for next generation high frequency radio communication providing fast communication and having a large capacity have been developed. In addition to the several characteristics mentioned above, resin materials having a low transmission loss, namely low dielectric resin materials having low dielectric constant and low dielectric loss tangent are demanded.

A polyimide resin excellent in the characteristics such as heat resistance, fire retardance, flexibility, electrical characteristics and chemical resistance is widely used for an electric and an electronic component, a semiconductor, communication device and a circuit component thereof, a peripheral device thereof, etc. Meanwhile, hydrocarbon compounds such as petroleum and natural oil are known to have high insulation properties and low dielectric constants. In Patent Literature 1, the example that the skeleton of dimer diamine having long-chain alkyl is incorporated into a polyimide resin for providing both characteristics of the polyimide and the hydrocarbon compounds is described.

However, the polyimide resin described in Patent Literature 1 is good in the low dielectric loss tangent, but poor in the adhesion and the mechanical characteristics.

CITATION LIST

Patent Literature

Patent Literature 1: JP 2018-168369 A

SUMMARY OF INVENTION

Technical Problem

The purpose of the present invention is to provide a polyamic acid resin which has a novel structure and can be suitably used for a printed wiring board, and a resin composition that contains said polyamic acid resin, and the cured product thereof has a low dielectric loss tangent and is excellent adhesion, heat resistance and mechanical characteristics.

Solution to Problem

By the earnest research, the present inventors have found that the polyimide resin which is an imidization compound of a novel polyamic acid resin having the specific structure or the terminal-modified polyimide resin obtained by using the polyimide resin can solve the above problems so as to finish the present invention.

That is, the present invention relates to:

[1] A polyamic acid resin which is a reaction product of an amino phenol compound (a), an aliphatic diamino compound (b), a tetrabasic acid dianhydride (c), and an aromatic diamino compound (d),
wherein the polyamic acid resin has an amino group at both ends thereof.

[2] The polyamic acid resin according to item [1], wherein the amino phenol compound (a) is a compound represented by following formula (1):

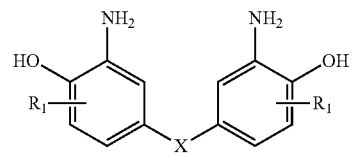

wherein in formula (1), $R_1$ independently represents a hydrogen atom, a methyl group, or an ethyl group, X represents a bivalent connection group represented by —C(CH$_3$)$_2$—, —C(CF$_3$)$_2$—, —SO$_2$— or following formula (2):

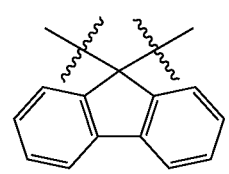

an oxygen atom, or a direct bond.

[3] The polyamic acid resin according to item [1] or [2], wherein the aliphatic diamino compound (b) is an aliphatic hydrocarbon having two amino groups and a carbon number of 6 to 36.

[4] The polyamic acid resin according to any one of items [1] to [3], wherein the tetrabasic acid dianhydride (c) is a compound selected from a group consisting of compounds represented by following formulas (3) to (6):

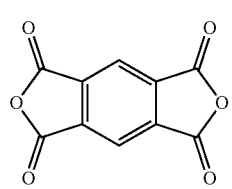

(4)
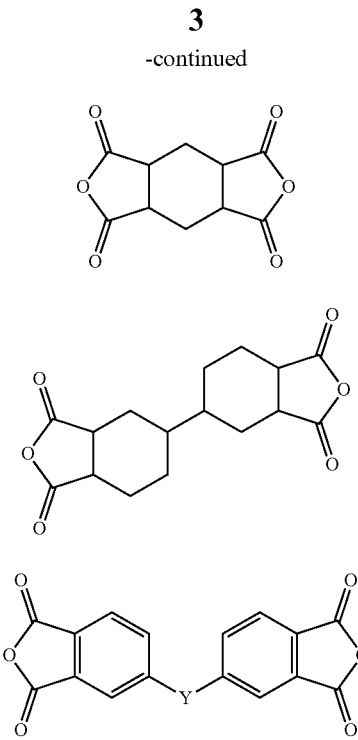

(5)

(6)

wherein in formula (6) Y represents a bivalent connection group represented by —C(CF$_3$)$_2$—, —SO$_2$—, —CO— or following formula (2):

(2)
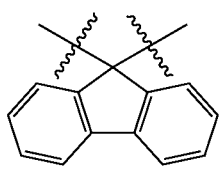

an oxygen atom, or a direct bond,

[5] The polyamic acid resin according to any one of items [1] to [4], wherein the aromatic diamino compound (d) is a compound selected from a group consisting of compounds represented by following formulas (7) to (11):

(7)

(8)
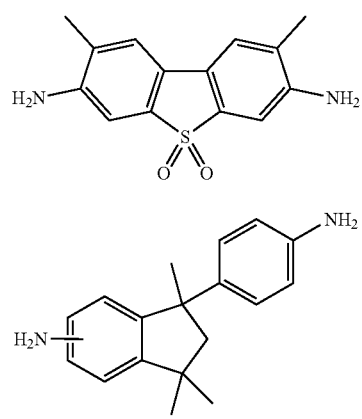

(9)
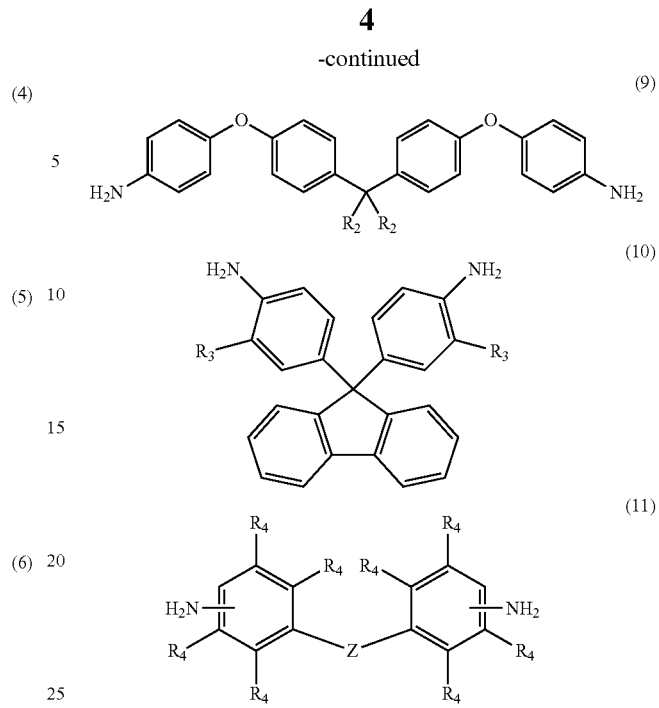

(10)

(11)

wherein in formula (9) R$_2$ independently represents a methyl group or a trifluoromethyl group, in formula (10) R$_3$ independently represents a hydrogen atom, a methyl group, or an ethyl group, in formula (11) Z represents a bivalent connection group represented by —CH(CH$_3$)—, —SO$_2$—, —CH$_2$—, —O—C$_6$H$_4$—O— or following formula (2):

(2)
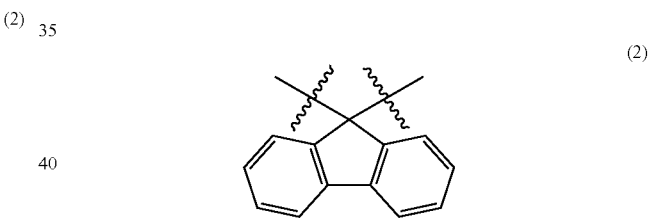

an oxygen atom, or a direct bond, R$_4$ independently represents a hydrogen atom, a methyl group, an ethyl group, or a trifluoromethyl group.

[6] The polyamic acid resin according to any one of items [1] to [5], wherein the number of mol of MA of the amino phenol compound (a), the number of mol of MB of the aliphatic diamino compound (b), the number of mol of MC of the tetrabasic acid dianhydride (c), and the number of mol of MD of the aromatic diamino compound (d) satisfy a relationship: $1.0<(MA+MB+MD)/MC<1.5$.

[7] A polyimide resin which is an imidization compound of the polyamic acid resin according to any one of items [1] to [6].

[8] A terminal-modified polyimide resin which is a reaction product of the polyimide resin according to item [7] and maleic anhydride.

[9] A resin composition comprising the polyimide resin according to item [7] or the terminal-modified polyimide resin according to item [8] and a compound capable of reacting to an amino group and/or a maleimide group.

[10] The resin composition according to item [9], wherein the compound capable of reacting to an amino group and/or a maleimide group is a maleimide resin.

[11] The resin composition according to item [9], wherein the compound capable of reacting to an amino group and/or a maleimide group is an epoxy resin.

[12] A cured product of the resin composition according to any one of items [9] to [11].

[13] A substrate comprising the cured product according to item [12].

Effects of the Invention

The printed wiring board, etc., excellent in the characteristics such as heat resistance, mechanical characteristics, dielectric properties and adhesion can be provided by using the polyimide resin of the present invention having the specific structure and the terminal-modified polyimide resin obtained by using the polyimide resin.

FORM TO CARRY OUT INVENTION

The polyamic acid resin of the present invention is a reaction product of amino phenol compound (a) (hereinafter also referred to as "component (a)" simply), aliphatic diamino compound (b) (hereinafter also referred to as "component (b)" simply), the tetrabasic acid dianhydride (c) (hereinafter also referred to as "component (c)" simply), and aromatic diamino compound (d) (hereinafter also described as "component (d)" simply). The polyamic acid resin has an amino group at both ends thereof. The polyimide resin of the present invention is an imidization compound of the polyamic acid resin described above.

The reaction of the components (a) to (d) is copolymerization reaction between the amino group in the components (a), (b) and (d) and the acid anhydride group in the moment (c). By using the components (a) to (d) so that the number of mol of MA of the component (a), the number of mol of MB of the component (b), the number of mol of MC of the component (c), and the number of mol of MD of the component (d) can satisfy the relationship MA+MB+MD>MC for the copolymerization reaction, the polyamic acid resin and polyimide resin having an amino group at both ends of the present invention is obtained. In this case, the value of (MA+MB+MD)/MC is preferably in the range of more than 1.0 and less than 2.0, more preferably in the range of more than 1.0 and less than 1.5. When the value is 2.0 or more, the polymerization of the polyamic acid resin and polyimide resin can be insufficient, besides various characteristics such as heat resistance and flexibility of the resin composition (described below) after curing can deteriorate because of the high remaining rate of the unreacted raw materials.

For the copolymerization reaction, the amount of the component (a) satisfying the conditions that the phenolic hydroxy group equivalent of the polyimide resin is in the range from 1,500 to 25,000 g/eq. is preferably used. When the phenolic hydroxy group equivalent is less than 1,500 g/eq., the dielectric loss tangent of the cured product of the resin composition containing the polyimide resin may be high because the polarity of the polyimide resin is high. When the phenolic hydroxy group equivalent is more than 25,000 g/eq., the adhesive strength and the mechanical characteristics of the cured product of the resin composition containing the polyimide resin may deteriorate.

Note that the phenolic hydroxy group equivalent in the present specification is a value measured according to JIS K-0070.

For the copolymerization reaction, the amount of the component (b) falling within the range from 10 to 50% by mass of the mass (the mass of the polyimide resin produced) obtained by subtracting the mass of the water, which is produced by the dehydration condensation and is equal to the double number of mol of the component (c), from the total mass of the component (a), the component (b), the component (c) and the component (d) is preferably used. When the amount of the component (b) is below the above range, the dielectric loss tangent may be high because the polyimide resin has very few aliphatic chains derived from the component (b). When the amount of the component (b) is above the above range, the heat resistance of the cured product may deteriorate because the polyimide resin has too many aliphatic chains derived from the component (b).

The polyimide resin of the present invention is obtained by the imidation reaction, namely the cyclization reaction due to the dehydration condensation, of the polyamic acid resin of the present invention. The amounts of the component (a), the component (b), the component (c) and the component (d) necessary to synthesize the polyimide resin having the purposed hydroxy group equivalent and the purposed amount of the aliphatic chain and having an amino group at both ends is easily calculated from each molecular weight of the components (a) to (d) used for the copolymerization reaction and the number of the phenolic hydroxy group of the component (a).

For example in the combination of BAPP (2,2-bis[4-(4-aminophenoxy)phenyl]propane, the molecular weight is 410.52 g/mol), PRIAMINE1075 (The molecular weight is 534.38 g/mol), ABPS (3,3'-diamino-4,4'-dihydroxydiphenylsulfone, the molecular weight is 280.30 g/mol) and ODPA (oxydiphthalic anhydride, the molecular is 310.22 g/mol) used as raw materials for the polyimide resin in Example 1 of the present invention, the total amount of BAPP, PRIAMINE1075 and ABPS to 1 mol of ODPA is preferably more than 1 mol (hereinafter also described as "1 mol+α") to produce the polyimide resin having an amine at both ends. The total amount of BAPP, PRIAMINE1075 and ABPS to 1 mol of ODPA is preferably less than 2 mol to reduce the remaining unreacted raw material components.

In this case, for purpose that the phenolic hydroxy group equivalent of the polyimide resin is in the range from 1,500 to 25,000 g/eq., for example, when the total amount of BAPP, PRIAMINE1075 and ABPS to 1 mol of ODPA is about 1 mol (1 mol+α), the amount of ABPS may be approximately 0.02 mol or more. When the total amount of BAPP, PRIAMINE1075 and ABPS to 1 mol of ODPA is 1.5 mol, the amount of ABPS may be approximately 0.03 mol or more. When the total amount of BAPP, PRIAMINE1075 and ABPS to 1 mol of ODPA is 2 mol, the amount of ABPS may be approximately 0.04 mol or more.

In this case, for purpose that 10 to 50% by mass of the polyimide resin produced is the aliphatic chain derived from the component (b), for example, when the total amount of BAPP, PRIAMINE1075 and ABPS to 1 mol of ODPA is about 1 mol (1 mol+α), the amount of PRIAMINE1075 may be approximately 0.13 mol or more. When the total amount of BAPP, PRIAMINE1075 and ABPS to 1 mol of ODPA is 1.5 mol, the amount of ABPS may be approximately 0.19 mol or more. When the total amount of BAPP, PRIAMINE1075 and ABPS to 1 mol of ODPA is 2 mol, the amount of ABPS may be approximately 0.25 mol or more.

The component (a) used for the synthesis of the polyamic acid resin (and the polyimide resin) of the present invention is not particularly limited as long as the component (a) is the compound having at least two amino groups and at least one phenolic hydroxy group in one molecule. Examples of the component (a) include 3,3'-diamino-4,4'-dihydroxydiphenyl sulfone, 3,3'-diamino-4,4'-dihydroxydiphenyl ether, 3,3'-diamino-4,4'-dihydroxybiphenyl, 3,3'-diamino-4,4'-dihydroxybenzophenone, 2,2-bis(3-amino-4-hydroxyphenyl)methane, 2,2-bis(3-amino-4-hydroxyphenyl)ethane, 2,2-bis(3-amino-4-hydroxyphenyl)propane, 1,3-hexafluoro-2,2-bis(3-amino-4-hydroxyphenyl)propane and 9,9'-bis(3-amino-4-hydroxyphenyl)fluorene. These compounds may be used alone or in mixture of two or more.

The component (a) used for the synthesis of the polyamic acid resin (and the polyimide resin) of the present invention is preferably a compound represented by following formula (1).

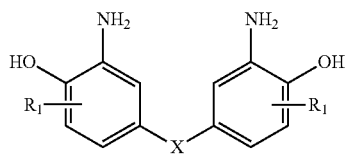

In formula (1), $R_1$ independently represents a hydrogen atom, a methyl group, or an ethyl group, X represents a bivalent connection group represented by —$C(CH_3)_2$—, —$C(CF_3)_2$—, —$SO_2$— or following formula (2), an oxygen atom, or a direct bond. Note that the direct bond indicates the conditions that two phenyl parts directly combine with each other not

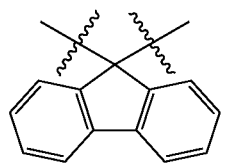

The component (b) used for the synthesis of the polyamic acid resin (and the polyimide resin) of the present invention is not particularly limited as long as the component (b) is a compound having at least two amino groups in one molecule. Examples of the component (b) include hexamethylenediamine, 1,3-bis(aminomethyl)cyclohexane, dimer diamine and diaminopolysiloxane. These compounds may be used alone or in mixture of two or more.

The dimer diamine described in the section of the examples of the component (b) is a compound obtained by substituting primary amino group with two carboxy groups contained in the dimer acid that is the dimer of the unsaturated fatty acid such as oleic acid (see Japanese Patent Application Publication No. H9-12712A and the like). The commercially available examples of the dimer diamine include PRIAMINE1074 and PRIAMINE1075 (both manufactured by Croda Japan KK), and Versamine551 (manufactured by BASF Japan Ltd.). These compounds may be used alone or in mixture of two or more. In the next section the non-limiting general formulas of the dimer diamine are shown (In each formula m+n=6 to 17 are preferable, p+q=8 to 19 are preferable, and the broken line means a carbon-carbon single bond or a carbon-carbon double bond.).

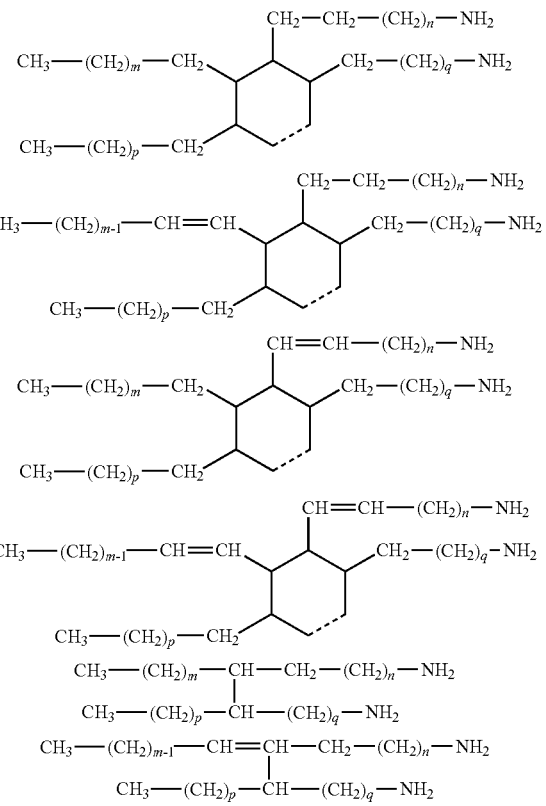

The component (c) used for the synthesis of the polyamic acid resin (and the polyimide resin) of the present invention is not particularly limited as long as the component (c) is a compound having two acid anhydride groups in one molecule. Examples of the component (c) include pyromellitic anhydride, ethylene glycol-bis(anhydrotrimellitate), grycelin-bis(anhydrotrimellitate)monoacetate, 1,2,3,4-butanetetra carboxylic acid dianhydride, 3,3',4,4'-diphenylsulfonetetra carboxylic acid dianhydride, 3,3',4,4'-benzophenontetra carboxylic acid dianhydride,3,3',4,4'-biphenyltetra carboxylic acid dianhydride,3,3',4,4'-diphenylethertetra carboxylic acid dianhydride, 5-(2,5-dioxotetrahydro-3-franyl)-3-methylcyclohexene-1,2-dicarboxylic acid anhydride, 3a,4,5,9b-tetrahydro-5-(tetrahydro-2,5-dioxo-3-franyl)-naphto[1,2-c]furan-1,3-dione, 1,2,4,5-cyclohexanetetra carboxylic acid dianhydride, bicyclo(2,2,2)-octo-7-ene-2,3,5,6-tetra carboxylic acid dianhydride and bicyclo[2,2,2]octane-2,3,5,6-tetra carboxylic acid dianhydride, 5,5'-((propane-2,2-diylbis(4,1-phenylene))bis(oxy))bis(isobenzofuran-1,3-dione). Above all in view of the solvent solubility, the adhesion to the substrate, and the photosensitivity, 3,3',4,4'-diphenylsulfonetetra carboxylic acid dianhydride, 3,3',4,4'-benzophenontetra carboxylic acid dianhydride, 3,3',4,4'-biphenyltetra carboxylic acid dianhydride or 3,3',4,4'-diphenylethertetra carboxylic acid dianhydride is preferable. These compounds may be used alone or in mixture of two or more.

The component (c) used for the synthesis of the polyamic acid resin (and the polyimide resin) of the present invention preferably contains a compound selected from a group consisting of the compound represented by the following formulas (3) to (6).

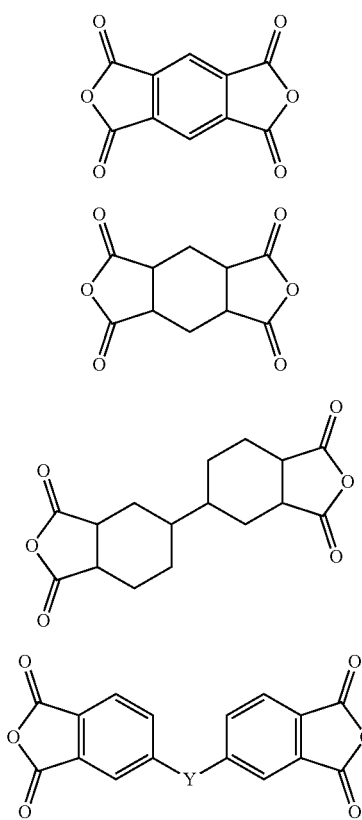

(3)

(4)

(5)

(6)

In formula (6) Y represents a bivalent connection group represented by —C(CF$_3$)$_2$—, —SO$_2$—, —CO—, or formula (2) described above, an oxygen atom, or a direct bond. The direct bond represented by Y indicates the conditions that both the right and the left aromatic groups directly combines with each other not through atoms, when Y is positioned as a center of the compound.

The component (d) used for the synthesis of the polyamic acid resin (and the polyimide resin) of the present invention is not particularly limited as long as the component (d) is a compound except for the component (a) aforementioned, which is an aromatic compound having two amino groups in one molecule. Examples of the component (d) include m-phenylenediamine, p-phenylenediamine, m-tolylenediamine, 4,4'-diaminodiphenylether, 3.3'-dimethyl-4,4'-diaminodiphenylether, 3,4'-diaminodiphenylether, 4,4'-diaminodiphenylthioether, 3.3'-dimethyl-4,4'-diaminodiphenylthioether, 3,3'-diethoxy-4,4'-diaminodiphenylthioether, 3,3'-diaminodiphenylthioether, 4,4'-diamonobenzophenon, 3,3'-dimethyl-4,4'-diaminobenzophenon, 3,3'-diaminodiphenylmethane, 4,4'-diaminodiphenylmethane, 3,4'-diaminodiphenylmethane, 3,3'-dimethoxy-4,4'-diaminodiphenylthioether, 2,2'-bis(3-aminophenyl)propane, 2,2'-bis(4-aminophenyl)propane, 4,4'-diaminodiphenylsulfoxide, 3,3'-diaminodiphenylsulfonesulfone, 4,4'-diaminodiphenylsulfonesulfone, benzidine, 3,3'-dimethylbenzidine, 3,3'-dimethoxybenzidine, 3,3'-diaminobiphenyl, p-xylylenediamine, m-xylylenediamine, o-xylylenediamine, 2,2'-bis(3-aminophenoxyphenyl)propane, 2,2'-bis(4-aminophenoxyphenyl)propane, 1,3-bis(4-aminophenoxyphenyl)benzene, 1,3-bis(3-aminophenoxyphenyl)propane, bis(4-amino-3-methylphenyl)methane, bis(4-amino-3,5-dimethylphenyl) methane, bis(4-amino-3-ethylphenyl)methane, bis(4-amino-3,5-diethylphenyl)methane, bis(4-amino-3-propylphenyl) methane and bis(4-amino-3,5-dipropylphenyl)methane. These compounds may be used alone or in mixture of two or more.

The component (d) used for the synthesis of the polyamic acid resin (and the polyimide resin) of the present invention preferably contains a compound selected from a group consisting of the compound represented by following formulas (7) to (11).

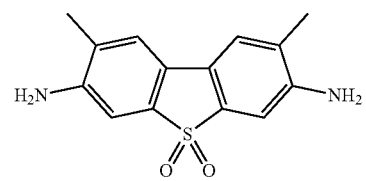

(7)

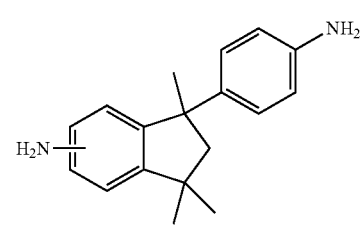

(8)

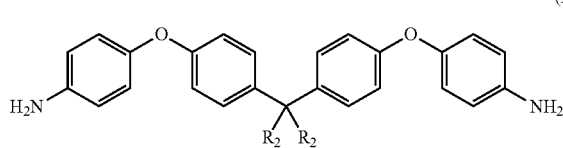

(9)

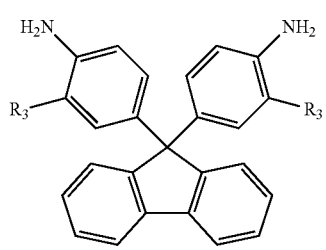

(10)

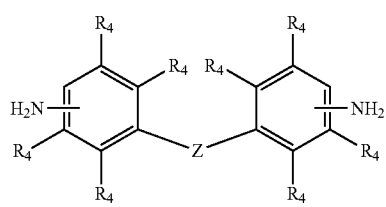

(11)

In formula (9), R$_2$ independently represents a methyl group or a trifluoromethyl group; in formula (10), R$_3$ independently represents a hydrogen atom, a methyl group or an ethyl group; in formula (11), Z represents a bivalent connection group represented by —CH(CH$_3$)—, —SO$_2$—, —CH$_2$—, —O—C$_6$H$_4$—O— or formula (2) described above, an oxygen atom, or a direct bond; R$_4$ independently represents a hydrogen atom, a methyl group, an ethyl group or a trifluoromethyl group. Note that the direct bond represented by Z indicates the conditions that both the right and the left aromatic groups directly combine with each other not through any atom when Z is positioned as a center of the compound.

The polyamic acid resin and the polyimide resin of the present invention can be synthesized by the known method.

For example, after the component (a) to (d) used for the synthesis are solved in the solvent, the copolymerization reaction of the diamine and tetrabasic acid dianhydride occur by stirring and heating at 10 to 80° C. under an inert gas atmosphere such as nitrogen to obtain the polyamic acid resin of the present invention solution.

The imidation reaction (the ring closure reaction with dehydration) occur by stirring and heating at 100 to 300° C. after adding the dehydrating agent and the catalyst to the polyamic acid resin solution obtained above if necessary to obtain the polyimide resin of the present invention solution. The dehydrating agent include toluene and xylene. The catalyst include pyridine and triazine. Moreover, when polyamic acid resin and polyimide resin are synthesized the reaction time is largely affected by the reaction temperature. The reaction is preferably carried out until the viscosity rises to an equilibrium according to the proceeding of the reaction and the maximum molecular weight is obtained. The reaction time is generally several minutes to 20 hours.

In the examples, the polyimide resin is synthesized via the polyamic acid resin. But the copolymerization reaction and the imidation reaction may occur simultaneously by adding the dehydrating agent and the catalyst if necessary, stirring and heating at 100 to 300° C. after the component (a) to (d) used for the synthesis are solved in the solvent to obtain the polyimide resin. After adding the polyamic acid resin solution or the polyimide resin solution obtained aforementioned to the poor solvent such as methanol and hexane to separate the polymer generated, the high purity polyamic acid resin or polyimide resin can be obtained by purifying by the reprecipitation method to remove the byproduct Examples of the solvent used for the synthesis of the polyamic acid resin or the polyimide resin include methylethylketone, methylpropylketone, methylisopropylketone, methylbutylketone, methylisobutylketone, methyln-hexylketone, diethylketone, diisopropylketone, diisobutylketone, cyclopentanone, cyclohexanone, methylcyclohexanone, acetylacetone, γ-butyrolactone, diacetonealcohol, cyclohexene-1-one, dipropylether, diisopropylether, dibutylether, tetrahydrofuran, tetrahydropyran, ethylisoamylether, ethyl-t-butylether, ethylbenzilether, cresylmethylehter, anisole, phenetole, methyl acetate, ethyl acetate, propyl acetate, isopropyl acetate, butyl acetate, isobutyl acetate, amyl acetate, isoamyl acetate, 2-ethylhexyl acetate, cyclohexyl acetate, methylcyclohexyl acetate, benzil acetate, acetoacetic methyl, acetoacetic ethyl, methyl propionate, ethyl propionate, butyl propionate, benzil propionate, methyl butyrate, ethyl butyrate, isopropyl butyrate, butyl butyrate, isoamyl butyrate, methyl lactate, ethyl lactate, butyl lactate, ethyl isovalerate, isoamyl isovalerate, diethyl oxalate, dibutyl oxalate, methyl benzoate, ethyl benzoate, propyl benzoate, methyl salicylate, N-methyl pyrrolidone, N,N-dimethyl formaldehyde, N,N-dimethyl acetoamide and dimethyl sufoxide, but is not limited to these compounds. These compounds may be used alone or in mixture of two or more.

The terminal-modified polyimide resin of the present invention is a polyimide resin produced by modifying the ends of the polyimide resin of the present invention with the maleic anhydride. The modification of the ends is generated by the copolymerization reaction and the imidation reaction of the amino group positioned at both ends in polyimide resin of the present invention with the maleic anhydride. Thereby, both ends of the polyimide resin are made to be maleimide groups.

The terminal-modified polyimide resin solution is obtained by adding the required amount of the maleic anhydride to the polyimide resin solution and then stirring and heating at 150 to 250° C. When the water generated by the reaction is remained in the reaction system, the copolymerization reaction is preferably carried out while the water is removed.

In the terminal-modification, slightly more than 2 mol of the maleic anhydride to 1 mol of the polyimide resin is preferably used. When the amount of the maleic anhydride to 1 mol of the polyimide resin is less than 2 mol or when the amount of the maleic anhydride is excessive, the molecular weight of the terminal-modified polyimide resin is high, so the handling may be difficult.

The resin composition of the present invention contains the polyimide resin of the present invention or the terminal-modified polyimide resin of the present invention and the compound capable of reacting to an amino group and/or a maleimide group (hereinafter the compound capable of reacting to an amino group and/or a maleimide group is also described simply as "reactive compound").

The reactive compound is not particularly limited as long as the reactive compound is a compound (resin) having two or more reactive groups capable of reacting to the amino group and/or the maleimide group in one molecule.

Examples of the reactive compound include MIR-3000 (manufactured by Nippon Kayaku Co., Ltd.), BMI-70, BMI-80 (both manufactured by K■I Chemical Industry Co., Ltd.), BMI-1000, BMI-3000 (both manufactured by Daiwa Kasei Industry Co., Ltd.), jER828 (manufactured by Mitsubishi Chemical Corporation), NC-3000, XD-1000 (both manufactured by Nippon Kayaku Co., Ltd.), isophthalic acid, terephthalic acid, KarenzMT PE1 (manufactured by Showa Denko K.K.), hexamethylenediamine, KAYARAD R-115 (manufactured by Nippon Kayaku Co., Ltd.). The maleimide resin or the epoxy resin is preferable.

The resin composition containing the polyimide resin of the present invention preferably contains the reactive compound so that the reactive group equivalent of the reactive compound can be 0.1 to 500 equivalent to 1 equivalent of the active hydrogen of the amino groups at both end of the polyimide resin. The resin composition containing the terminal-modified polyimide resin of the present invention preferably contains the reactive compound so that the reactive group equivalent of the reactive compound can be 0.1 to 500 equivalent to 1 equivalent of the maleimide group of the terminal-modified polyimide resin. When the reactive group of the reactive compound has the reactivity to the phenolic hydroxy group, the reactive compound having 0.1 to 500 equivalent of the reactive group equivalent to 1 equivalent of the phenolic hydroxy group of the polyimide resin may be further used in addition to the reactive compound having 0.1 to 500 equivalent of the reactive group equivalent to 1 equivalent of the active hydrogen or maleimide group.

The maleimide resin used as a reactive compound is not particularly limited as long as the maleimide resin has two or more maleimide groups in one molecule. Because the curd products of the resin composition are excellent in the characteristics such as mechanical strength and fire retardance, the maleimide resin having an aromatic ring such as a benzene ring, a biphenyl ring and a naphthalene ring is preferable. The examples of the maleimide resin include MIR-3000 (manufactured by Nippon Kayaku Co., Ltd.).

The maleimide resin is added to react with the terminal amino group of the polyimide resin or the terminal maleimide group of the terminal-modified polyimide resin. By adding the maleimide resin, the crosslinking density of the cured products increases, the resistance to the polar solvent improves, and the adhesion to the substrate and the heat resistance improves.

The curing temperature of the resin composition containing the maleimide resin is preferably 150 to 250° C. The curing time depends on the curing temperature and is generally about several minutes to several hours.

The content of the maleimide resin in the resin composition of the present invention containing the polyimide resin and the maleimide resin is preferably a content satisfying that the maleimide group equivalent of the maleimide resin is 0.1 to 500 equivalent to 1 equivalent of the active hydrogen of the amino groups at the both ends of the polyimide resin.

The content of the maleimide resin in the resin composition of the present invention containing the terminal-modified polyimide resin and the maleimide resin is preferably a content satisfying that the maleimide group equivalent of the maleimide resin is 0.1 to 500 equivalent to 1 equivalent of the maleimide group of the terminal-modified polyimide resin.

Note that the term "equivalent" described above means a value calculated from the use amount of each raw material in the synthesis of the polyimide resin or the terminal-modified polyimide resin.

To accelerate the curing reaction of the maleimide resin, various kinds of the radical initiator can be added to the resin composition of the present invention containing the maleimide resin, if necessary. The examples of the radical initiator include peroxides such as dicumylperoxide and dibutylperoxide, azo compounds such as 2,2'-azobis(isobutyronitrile) and 2,2'-azobis(2,4-dimethyl valeronitrile).

The content of the radical initiator in the resin composition of the present invention containing the maleimide resin is 0.1 to 10% by mass to the maleimide resin.

The epoxy resin used as a reactive compound is not particularly limited as long as the epoxy resin has two or more epoxy groups in one molecule. Because the curd products of the resin composition are excellent in the characteristics such as mechanical strength and fire retardance, the epoxy resin having an aromatic ring such as a benzene ring, a biphenyl ring and a naphthalene ring is preferable. The examples of the epoxy resin include jER828 (Mitsubishi Chemical Corporation), NC-3000 and XD-1000 (both manufactured by Nippon Kayaku Co., Ltd.).

The epoxy resin is added to react with the terminal amino group of the polyimide resin or the terminal maleimide group of the terminal-modified polyimide resin. By adding the epoxy resin, the crosslinking density of the cured products increases, the resistance to the polar solvent improves, and the adhesion to the substrate and the heat resistance improves.

The curing temperature of the resin composition containing the epoxy resin is preferably 150 to 250° C. The curing time depends on the curing temperature and is generally about several minutes to several hours.

The content of the epoxy resin in the resin composition of the present invention containing the polyimide resin and the epoxy resin is preferably a content satisfying that the epoxy equivalent of the epoxy resin is 0.1 to 500 equivalents to 1 equivalent of the active hydrogen of the amino groups at both ends of the polyimide resin. Note that because the epoxy group contained in the epoxy resin has the reactivity to the phenolic hydroxy group, the epoxy resin having a content satisfying that the epoxy equivalent of the epoxy resin is 0.1 to 500 equivalents to 1 equivalent of the phenolic hydroxy group of the polyimide resin is the preferably added, if necessary.

The content of the epoxy resin in the resin composition of the present invention containing the terminal-modified polyimide resin and the epoxy resin is preferably a content satisfying that the epoxy equivalent of the epoxy resin is 0.1 to 500 equivalents to 1 equivalent of the maleimide group of the terminal-modified polyimide resin. Note that because the epoxy group contained in the epoxy resin has the reactivity to the phenolic hydroxy group, the epoxy resin having a content satisfying that the epoxy equivalent of the epoxy resin is 0.1 to 500 equivalents to 1 equivalent of the phenolic hydroxy group of the terminal-modified polyimide resin is preferably added, if necessary.

Note that the term "equivalent" described above means a value calculated from the use amount of each raw material in the synthesis of the polyimide resin or the terminal-modified polyimide resin.

To accelerate the curing reaction of the epoxy resin, the various kinds of the heat curing catalyst can be added to the resin composition of the present invention containing the epoxy resin, if necessary. The examples of the heat curing catalyst include imidazoles such as 2-methylimidazol, 2-ethylimidazole, 2-ethyl-4-methylimidazole, 2-phenyl-4,5-dihydroxymethylimidazole, and 2-phenyl-4-methyl-5-hydroxymethylimidazole, tertiary amines such as 2-(dimethylaminomethyl)phenol, and 1,8-diaza-bicyclo (5,4,0) undecene-7, phosphines such as triphenylphosphine, metal compounds such as tin octylate.

The content of the heat curing catalyst in the resin composition of the present invention containing the epoxy resin is 0.1 to 10% by mass to the epoxy resin.

The composition in the varnish state (hereinafter described as varnish) may be obtained by using the organic solvent with the resin composition of the present invention. Examples of the solvent used include γ-butyrolactones, amide solvents such as N-methylpyrrolidone, N,N-dimethylformamide, N,N-dimethylacetoamide, and N,N-dimethylimidazolidinone, sulfones such as tetramethylenesulfone, ether solvent such as diethyleneglycoldimethylether, diethyleneglycoldiethylether, propyleneglycol, propyleneglycolmonomethylether, propyleneglycolmonomethylethermonoacetate, and propyleneglycolmonobutylether, ketone solvents such as methylethylketone, methyisobutylketone, cyclopentanone, and cyclohexanone, and aromatic solvents such as toluene and xylene.

The solvent is used in the range where the concentration of the solid content except the organic solvent in the varnish is generally 10 to 80% by mass, preferably 20 to 70% by mass.

The known additives may be used together with the resin composition of the present invention, if necessary. The examples of the additives used together include the curing agent for the epoxy resin, polybutadiene, or modified material thereof, modified material of acrylonitrile copolymer, polyphenylene ether, polystyrene, polyethylene, polyimide, fluororesin, maleimide compound, cyanate ester compound, silicone gel, silicone oil, and inorganic filler such as silica, alumina, calcium carbonate, quartz powder, aluminum powder, graphite, talc, clay, iron oxide, titanium oxide, aluminum nitride, asbestos, mica, glass powder, surface treatment agent for the filler such as silane coupling agent, release agent, coloring agent such as carbon black, phtharocyanine blue, phtharocyanine green. The amount of the additives is preferably less than 1,000 parts by mass, more preferably less than 700 parts by mass, to 100 parts by mass of the resin composition.

The preparation method of the resin composition of the present invention is not particularly limited but may be simply mixing each component homogenously or producing the prepolymer. For example, by heating the polyimide resin or the terminal-modified polyimide resin of the present invention and the reactive compound in the presence or absence of the catalyst and in the presence or absence of the solvent, the prepolymer can be obtained. For mixing each component or producing the prepolymer the extruder, the kneader, the roll and the like are used in the absence of the solvent and the reaction tank with stirrer and the like are used in the presence of the solvent.

The reinforced fiber such as glass fiber, carbon fiber, polyester fiber, polyamide fiber, and/or alumina fiber is soaked with the resin composition of the present invention which is melted by heating to have low viscosity to obtain the prepreg. The reinforced fiber is also dried by heating after soaking with the varnish aforementioned to obtain the prepreg.

After the prepreg described above is cut to a desired shape and laminated with the copper foil and the like if necessary, while the laminated material is pressed by methods such as press forming method, autoclave forming method, or sheet-winding forming method, the resin composition is cured by heating to obtain the substrate of the present invention such as the laminated board for the electric and electronic part (the printed wiring board) and the carbon-fiber-reinforced material.

After the copper foil is coated with the resin composition and the solvent is evaporated, the copper foil is laminated with a polyimide film or an LCP (liquid crystal polymer) and pressed while being heated. Then the laminated material is cured by heating to obtain the substrate of the present invention. In some cases, the polyimide film or the LCP is coated with the resin composition and laminated with the copper foil to obtain the substrate of the present invention.

EXAMPLES

The present invention is now described in more detail with reference to Examples and Comparative Examples as follows and is not limit to these Examples. Note that in Examples the term "part" means "part by mass", and the term "%" means "% by mass".

Example 1 (Synthesis of Polyimide Resin of Present Invention)

16.40 parts of BAPP (2,2-bis[4-(4-aminophenoxy)phenyl] propane, manufactured by Wakayama Seika Kogyo Co., Ltd., molecular weight: 410.52 g/mol.), 10.87 parts of PRAIMINE1075 (manufactured by Croda Japan KK, molecular weight: 534.38 g/mol.), 0.32 parts of ABPS (3,3'-diamino-4,4'-dihydroxydiphenylsulfone, manufactured by Nippon Kayaku Co., Ltd. molecular weight: 280.30 g/mol), and 106.47 parts of NMP (N-methylpyrrolidone) were added into a reactor with a total volume of 300 ml having a thermometer, a reflux cooler, a Dean-Stark apparatus, a powder inlet port, an nitrogen introduction device, and a stirrer and heated to 70° C. Next 18.04 parts of ODPA (oxydiphthalic anhydride, manufactured by Manac Incorporated, molecular weight: 310.22 g/mol.), 0.92 parts of pyridine, and 23.77 parts of toluene were added. While the water generated by the cyclization of the amic acid was removed by azeotropy with toluene, the reaction was carried out at 180° C. for 4 hours. After the generation of the water stopped, the remaining pyridine and toluene were continuously removed at 180° C. to obtain the polyimide resin solution (A-1) (nonvolatile component 31.2%). The molar ratio of the diamine component (component (a), component (b) and component (d)) to the acid anhydride component (component (c)) used in Example 1 was 1.05 (the molar ratio is "the number of mol of the diamine component/the number of mol of the acid anhydride component").

Example 2 (Synthesis of Terminal-Modified Polyimide Resin of Present Invention)

16.40 parts of BAPP (2,2-bis[4-(4-aminophenoxy)phenyl] propane, manufactured by Wakayama Seika Kogyo Co., Ltd., molecular weight: 410.52 g/mol.), 10.87 parts of PRIAMINE1075 (manufactured by Croda Japan KK, molecular weight: 534.38 g/mol.), 0.32 parts of ABPS (3,3'-diamino-4,4'-dihydroxydiphenylsulfone, manufactured by Nippon Kayaku Co., Ltd. molecular weight: 280.30 g/mol), and 106.47 parts of NMP (N-methylpyrrolidone) were added into a reactor with a total volume of 300 ml having a thermometer, a reflux cooler, a Dean-Stark apparatus, a powder inlet port, an nitrogen introduction device, and a stirrer and heated to 70° C. Next 18.04 parts of ODPA (oxydiphthalic anhydride, manufactured by Manac Incorporated, molecular weight: 310.22 g/mol.), 0.92 parts of pyridine, and 23.77 parts of toluene were added. While the water generated by the cyclization of the amic acid was removed by azeotropy with toluene, the reaction was carried out at 180° C. for 4 hours. After the generation of the water stopped, 0.57 parts of the maleic anhydride (molecular weight: 98.1 g/mol) was added. While the water generated by the cyclization of the amic acid was removed by azeotropy with toluene, the reaction was carried out at 180° C. for 2 hours to modify the amino groups at the end of the polyimide resin into the maleimide groups. After the generation of the water stopped, the remaining pyridine and toluene continuously were removed at 180° C. to obtain the terminal-modified polyimide resin solution (A-2) (nonvolatile component: 31.0%). The molar ratio of the diamine component to the acid anhydride component used in Example 2 was 1.05.

Comparative Example 1 (Synthesis of Polyimide Resin for Comparison)

290.00 parts of 9,9'-bis[4-(3,4-dicarboxyphenoxy)phenyl] fluorenic acid dianhydride (trade name "BPF-PA", manufactured by JFE Chemical Corporation), 980.20 parts of cyclohexanone, and 196.04 parts of methylcyclohexane were added into a reactor having a stirrer, a water divider, a thermometer, and an nitrogen gas introduction tube and heated to 60° C. Next 236.60 parts of the commercially available dimer diamine (trade name "PRIAMINE1075" manufactured by Croda Japan KK) was added dropwise, then the imidation reaction was carried out at 140° C. for 12 hours to obtain the polyimide resin solution for the comparison (R-1) (nonvolatile component: 31.6%). The molar ratio of the diamine component to the acid anhydride component used in Comparative Example 1 was 0.97.

Examples 3 to 6, Comparative Examples 2 and 3

The polyimide resin solution (A-1) obtained in Example 1, the terminal-modified polyimide resin solution (A-2)

obtained in Example 2, the polyimide resin solution for comparison obtained in Comparative Example 1 (R-1), MIR-3000 manufactured by Nippon Kayaku Co., Ltd. (a maleimide resin having a biphenyl skeleton) as a maleimide resin, dicumylperoxide (DCP) as a radical initiator, NC-3000 manufactured by Nippon Kayaku Co., Ltd. (an epoxy resin having a biphenyl skeleton, epoxy equivalent: 277 g/eq., softening point: 60° C.) as an epoxy resin, GPH-65 manufactured by Nippon Kayaku Co., Ltd. (a phenol softening agent having a biphenyl skeleton, hydroxy group equivalent: 198 g/eq.) as an epoxy resin curing agent, and C11Z-A manufactured by SHIKOKU CHEMICALS CORPORATION as a curing accelerator were mixed in accordance with the amounts for blending (the unit is part) listed in Table 1 to obtain the resin composition of the present invention and the resin composition for comparison.

of 10 mm. The 90° peeling strength (peeling rate: 50 mm/min) between the copper foils was measured by using Autograph AGS-X-500N (manufactured by Shimadzu Corporation) to evaluate the adhesive strength of the copper foil.

On visually observing the samples after the tests, all the samples in which the films were formed on the Cu mirror surfaces or the T4X surfaces delaminated at the interfaces between the Cu mirror surface or the T4X surface and the films. The samples in which the films were formed on the Cu rough surfaces delaminated at the interfaces between the Cu rough surfaces and the films.

The results were shown in Tables 2, 3, and 4.

(Evaluation of Mechanical Characteristics, Thermal Characteristics and Dielectric Loss Tangent)

By the same method as the method in "Evaluation of Adhesive Strength" aforementioned, the films having a

TABLE 1

The composition of the resin composition

|  | Example 3 | Example 4 | Comparative Example 2 | Example 5 | Example 6 | Comparative Example 3 |
|---|---|---|---|---|---|---|
| A-1 | 100 |  |  | 100 |  |  |
| A-2 |  | 100 |  |  | 100 |  |
| R-1 |  |  | 100 |  |  | 100 |
| MIR-3000 | 7.5 | 7.5 | 7.5 |  |  |  |
| DCP | 0.375 | 0.375 | 0.375 |  |  |  |
| NC-3000 |  |  |  | 4.4 | 4.4 | 4.4 |
| GPH-65 |  |  |  | 3.1 | 3.1 | 3.1 |
| C11Z-A |  |  |  | 0.375 | 0.375 | 0.375 |

(Evaluation of Adhesive Strength)

Using the (terminal-modified) polyimide resin solutions and the resin compositions obtained in Examples 1 to 6 and Comparative Examples 1 to 3, the adhesive strength of the polyimide resins, the terminal-modified polyimide resins and the resin compositions to a copper foil was evaluated.

The polyimide resin solution, the terminal polyimide resin solution, or the resin composition aforementioned were applied on a shiny surface (hereinafter described as "Cu mirror surface"), a matte surface (hereinafter described as "Cu rough surface") of a copper foil CF-T9FZ-HTE manufactured by FUKUDA METAL FOIL & POWDER Co., Ltd., or a surface of a copper foil CF-T4X-SU-18 manufactured by FUKUDA METAL FOIL & POWDER Co., Ltd. (hereinafter described as "T4X") by using an automatic applicator and then dried by heating at 130° C. for 10 minutes. The thickness of the film after drying was 30 μm. On the film obtained in this manner on the copper foil, another copper foil was put for the rough surface of the Cu foil to face the film. Then the laminated material using the resin composition was vacuum pressed at 200° C. and the other laminated materials were vacuum pressed at 180° C. under the conditions of 3 Mpa for 60 minutes. The test pieces obtained were cut into a small piece having a width thickness of 30 μm were formed on Cu mirror surfaces, respectively. By the same method except for a thickness set by an automatic applicator as the method in "Evaluation of Adhesive Strength" aforementioned, the films of a thickness of 10 μm were formed on Cu mirror surfaces, respectively. The films obtained from the resin composition containing the maleimide rein in this manner on the copper foil were heated at 200° C. and the other films were heated at 180° C. for 60 minutes. Then, the copper foils were etched by ferric chloride solution having a specific gravity of liquid of 45 Baume degree, and washed by ion exchange water. After that the film cured products were obtained by drying at 105° C. for 10 minutes, respectively. For the film cured products, the tensile strength (the stress and the elongation at breaking point) and the elastic modulus were measured by using Autograph AGS-X-500N (manufactured by Shimadzu Corporation). The glass transition point was measured by using the dynamic viscoelasticity measuring device, EXSTAR6000 (manufactured by Seiko Epson Corp.). The dielectric loss tangent at 10 GHz was measured by using the network analyzer 8719ET (manufactured by Agilent Technologies Japan, Ltd.) by a cavity resonance method.

The results were shown in Table 2, 3, and 4.

TABLE 2

The evaluation result of polyimide resin and terminal-modified polyimide resin

|  |  | unit | Example 1 | Example 2 | Comparative Example 1 |
|---|---|---|---|---|---|
| Adhesive strength | Cu rough surface | N/mm | 1.75 | 1.76 | 1.65 |
|  | Cu mirror surface |  | 0.70 | 0.69 | 0.60 |
|  | T4X |  | 1.40 | 1.42 | 1.20 |

TABLE 2-continued

The evaluation result of polyimide resin and terminal-modified polyimide resin

| | | unit | Example 1 | Example 2 | Comparative Example 1 |
|---|---|---|---|---|---|
| Mechanical chacacteristics | Stress at breaking point | Mpa | 85 | 84 | 75 |
| | Elongation at breaking point | % | 180 | 182 | 140 |
| | Elastic modulus | Mpa | 2210 | 2200 | 2200 |
| Thermal characteristics | Tg | °C. | 145 | 147 | 140 |
| | CTE | ppm | 110 | 110 | 122 |
| Dielectric loss tangent (10 Ghz) | | — | 0.0020 | 0.0020 | 0.0024 |

TABLE 3

The evaluation result of resin compositon containing maleimide resin

| | | unit | Example 3 | Example 4 | Comparative Example 2 |
|---|---|---|---|---|---|
| Adhesive strength | Cu rough surface | N/mm | 2.00 | 2.10 | 1.90 |
| | Cu mirror surface | | 0.52 | 0.59 | 0.46 |
| | T4X | | 1.45 | 1.49 | 1.31 |
| Mechanical chacacteristics | Stress at breaking point | Mpa | 85 | 90 | 77 |
| | Elongation at breaking point | % | 180 | 181 | 140 |
| | Elastic modulus | Mpa | 2700 | 2800 | 2700 |
| Thermal characteristics | Tg | °C. | 130 | 135 | 125 |
| | CTE | ppm | 140 | 135 | 135 |
| Dielectric loss tangent(10 Ghz) | | — | 0.0028 | 0.0027 | 0.0032 |

TABLE 4

The evaluation result of resin compositon containing epoxy resin

| | | unit | Example 5 | Example 6 | Comparative Example 3 |
|---|---|---|---|---|---|
| Adhesive strength | Cu rough surface | N/mm | 2.20 | 2.25 | 2.00 |
| | Cu mirror surface | | 0.50 | 0.55 | 0.45 |
| | T4X | | 1.45 | 1.48 | 1.30 |
| Mechanical chacacteristics | Stress at breakung point | Mpa | 84 | 90 | 74 |
| | Elongation at breaking point | % | 175 | 177 | 138 |
| | Elastic modulus | Mpa | 2400 | 2350 | 2350 |
| Thermal characteristics | Tg | °C. | 120 | 120 | 115 |
| | CTE | ppm | 130 | 130 | 135 |
| Dielectric loss tangent (10 Ghz) | | — | 0.0067 | 0.0065 | 0.0072 |

From the results of Tables 2 to 4, it was shown that the polyimide resin, the terminal-modified polyimide resin and the resin composition of the present invention were excellent in all adhesive strength, mechanical characteristics, thermal characteristics, and dielectric loss tangent. In contrast, Comparative Examples corresponding to the Examples were largely inferior in the mechanical characteristics and inferior in the adhesive strength, the thermal characteristics, and the dielectric loss tangent to the Examples.

Example 7 (Synthesis of Polyimide Resin of Present Invention)

11.01 parts of BAPP (2,2-bis[4-(4-aminophenoxy)phenyl]propane, manufactured by Wakayama Seika Kogyo Co., Ltd., molecular weight: 410.52 g/mol.), 20.49 parts of PRIAMINE1075 (manufactured by Croda Japan KK, molecular weight: 534.38 g/mol.), 1.59 parts of BAFA (2,2-bis(3-amino-4-hydroxyphenyl)hexafluoropropane, manufactured by Nippon Kayaku Co., Ltd. molecular weight: 366.26 g/mol), and 119.35 parts of cyclohexanone were added into a reactor with a total volume of 300 ml having a thermometer, a reflux cooler, a Dean-Stark apparatus, a powder inlet port, a nitrogen introduction device, and a stirrer and heated to 70° C. Next 20.53 parts of ODPA (oxydiphthalic anhydride, manufactured by Manac Incorporated, molecular weight: 310.22 g/mol.), 1.34 parts of triethylamine, and 25.69 parts of toluene were added. While the water generated by the cyclization of the amic acid was removed by azeotropy with toluene, the reaction was carried out at 140° C. for 4 hours. After the generation of the water stopped, the remaining triethylamine and toluene continuously were removed at 140° C. to obtain the polyimide resin solution (A-7) (nonvolatile component 30.0%). The molar ratio of the diamine component to the acid anhydride component used in Example 7 was 1.05.

Example 8 (Synthesis of Polyimide Resin of Present Invention)

9.88 parts of BAFL (9,9-bis(4-aminophenyl)fluorene, manufactured by JFE Chemical Corporation, molecular weight: 348.45 g/mol.), 20.42 parts of PRIAMINE1075 (manufactured by Croda Japan KK, molecular weight: 534.38 g/mol.), 1.67 parts of BAFA (2,2-bis(3-amino-4-hydroxyphenyl)hexafluoropropane, manufactured by Nippon Kayaku Co., Ltd., molecular weight: 366.26 g/mol), and 119.30 parts of cyclohexanone were added into a reactor with a total volume of 300 ml having a thermometer, a reflux cooler, a Dean-Stark apparatus, a powder inlet port, a nitrogen introduction device, and a stirrer and heated to 70° C. Next 21.63 parts of ODPA (oxydiphthalic anhydride, manufactured by Manac Incorporated, molecular weight: 310.22 g/mol), 1.41 parts of triethylamine, and 25.69 parts of toluene were added. While the water generated by the cyclization of the amic acid was removed by azeotropy with toluene, the reaction was carried out at 140° C. for 4 hours. After the generation of the water stopped, the remaining triethylamine and toluene were continuously removed at 140° C. to obtain the polyimide resin solution (A-8) (nonvolatile component 30.0%). The molar ratio of the diamine component to the acid anhydride component used in Example 8 was 1.02.

Comparative Example 4 (Synthesis of Polyimide Resin for Comparison)

6.10 parts of BAFL (9,9-bis(4-aminophenyl)fluorene, manufactured by JFE Chemical Corporation, molecular weight: 348.45 g/mol.), 11.38 parts of PRIAMINE1075 (manufactured by Croda Japan KK, molecular weight: 534.38 g/mol.),and 119.30 parts of cyclohexanone were added into a reactor with a total volume of 300 ml having a thermometer, a reflux cooler, a Dean-Stark apparatus, a powder inlet port, a nitrogen introduction device, and the stirrer and heated to 70° C. Next 12.41 parts of ODPA (oxydiphthalic anhydride, manufactured by Manac Incorporated, molecular weight: 310.22 g/mol), 0.81 parts of triethylamine, and 18.75 parts of toluene were added. While the water generated by the cyclization of the amic acid was removed by azeotropy with toluene, the reaction was carried out at 140° C. for 4 hours. After the generation of the water stopped, the remaining triethylamine and toluene were continuously removed at 140° C. to obtain the polyimide resin solution (R-2) (nonvolatile component 30.0%). The molar ratio of the diamine component to the acid anhydride component used in Comparative Example 4 was 0.97.

Examples 9 and 10, and Comparative Example 5

The polyimide resin solutions (A-7) and (A-8) obtained in Examples 7 and 8, the polyimide resin solution (R-2) for comparison obtained in Comparative Example 4, MIR-3000 manufactured by Nippon Kayaku Co., Ltd. (maleimide resin having biphenyl skeleton) as a maleimide resin and dicumylperoxide (DCP) as the radical initiator were mixed in accordance with the amounts to be blended (the unit is part) listed in Table 5 to obtain the resin composition of the present invention and the resin composition for comparison.

TABLE 5

The composition of resin composition

|  | Example 9 | Example 10 | Comparative Example 5 |
|---|---|---|---|
| A-7 | 100 | | |
| A-8 | | 100 | |
| R-2 | | | 100 |
| MIR-3000 | 12.86 | 12.86 | 12.86 |
| DCP | 0.429 | 0.429 | 0.429 |

(Evaluation of Adhesive Strength, Mechanical Characteristics, Thermal Characteristics, and Dielectric Loss Tangent)

Using the polyimide resin solutions and the resin compositions obtained in Examples 7 to 10 and Comparative Examples 4 and 5 according to the evaluation method of the polyimide resin solution, the terminal-modified polyimide resin solutions and the resin compositions obtained in Examples 1 to 6 and Comparative Examples 1 to 3, the adhesive strength to the copper foil, mechanical characteristics, thermal characteristics, and dielectric loss tangent of the polyimide resins and the resin compositions were evaluated.

The results were shown in Tables 6 and 7.

TABLE 6

The evaluation result of polyimide resin

|  |  | unit | Example 7 | Example 8 | Comparative Example 4 |
|---|---|---|---|---|---|
| Adhesive strength | Cu rough surface | N/mm | 1.63 | 1.16 | 0.88 |
|  | Cu mirror surface |  | 0.62 | 0.32 | 0.15 |
|  | T4X |  | 1.28 | 0.98 | 0.60 |
| Mechanical chacacteristics | Stress at breakung point | Mpa | 65 | 50 | 50 |
|  | Elongation at breaking point | % | 210 | 10 | 5 |
|  | Elastic modulus | Mpa | 1700 | 1700 | 1700 |
| Thermal characteristics | Tg | °C. | 100 | 140 | 100 |
|  | CTE | ppm | 150 | 190 | 180 |
| Dielectric loss tangent (10 Ghz) |  | — | 0.0015 | 0.0015 | 0.0027 |

TABLE 7

The evaluation result of resin compositon containing maleimide resin

|  |  | unit | Example 9 | Example 10 | Comparative Example 5 |
|---|---|---|---|---|---|
| Adhesive strength | Cu rough surface | N/mm | 1.54 | 1.35 | 0.80 |
|  | Cu mirror surface |  | 0.62 | 0.31 | 0.12 |
|  | T4X |  | 1.18 | 0.86 | 0.55 |

TABLE 7-continued

The evaluation result of resin compositon containing maleimide resin

| | | unit | Example 9 | Example 10 | Comparative Example 5 |
|---|---|---|---|---|---|
| Mechanical chacacteristics | Stress at breakung point | Mpa | 49 | 51 | 50 |
| | Elongation at breaking point | % | 139 | 11 | 5 |
| | Elastic modulus | Mpa | 2000 | 2100 | 1800 |
| Thermal characteristics | Tg | °C. | 140 | 180 | 120 |
| | CTE | ppm | 120 | 120 | 150 |
| Dielectric loss tangent(10 Ghz) | | — | 0.0016 | 0.0019 | 0.0029 |

INDUSTRIAL APPLICABILITY

By using the polyimide resin having the specific structure, the terminal-modified polyimide resin obtained by using said polyimide resin and the resin composition using these of the present invention, the printed wiring board, etc., excellent in the characteristics such as heat resistance, mechanical characteristics, low dielectric characteristics and adhesion can be provided.

The invention claimed is:

1. A polyimide resin which is an imidization compound of a polyamic acid resin which is a reaction product of an amino phenol compound (a) selected from a group consisting of 3,3'-diamino-4,4'-dihydroxydiphenylsulfone and 2,2-bis(3-amino-4-hydroxyphenyl) hexafluoropropane, at least one of an aliphatic diamino compound (b) comprising a dimer diamine, a tetrabasic acid dianhydride (c) comprising a compound of a following formula (6):

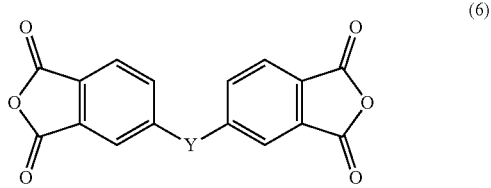

wherein in formula (6) Y represents a bivalent connection group represented by-C(CF$_3$)$_2$-,-SO2-,-CO-or following formula (2):

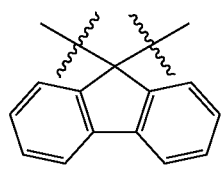

an oxygen atom, or a direct bond, and an aromatic diamino compound (d), wherein the polyamic acid resin has an amino group at both ends thereof, wherein a phenolic hydroxy group equivalent of the polyimide resin is in the range from 1,500 to 25,000 g/eq., and wherein an amount of the aliphatic diamino compound (b) is within a range from 10 to 50% of mass of the polyimide resin.

2. The polyamic acid resin according to claim 1, wherein the amino phenol compound (a) is a compound represented by following formula (1):

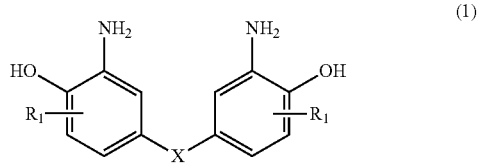

wherein in formula (1), R$_1$ independently represents a hydrogen atom, a methyl group, or an ethyl group, X represents a bivalent connection group represented by-C(CH$_3$)$_2$-,-C(CF$_3$)$_2$-,-SO$_2$-or following formula (2):

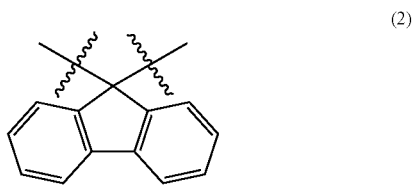 [SMILES: *C1(*)c2ccccc2-c2ccccc21]

an oxygen atom, or a direct bond.

3. The polyamic acid resin according to claim 1, wherein the aliphatic diamino compound (b) is an aliphatic hydrocarbon having two amino groups and a carbon number of 6 to 36.

4. The polyamic acid resin according to claim 1, wherein the aromatic diamino compound (d) is a compound selected from a group consisting of compounds represented by following formulas (7) to (11):

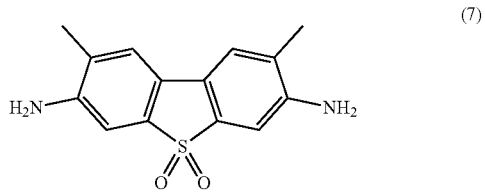

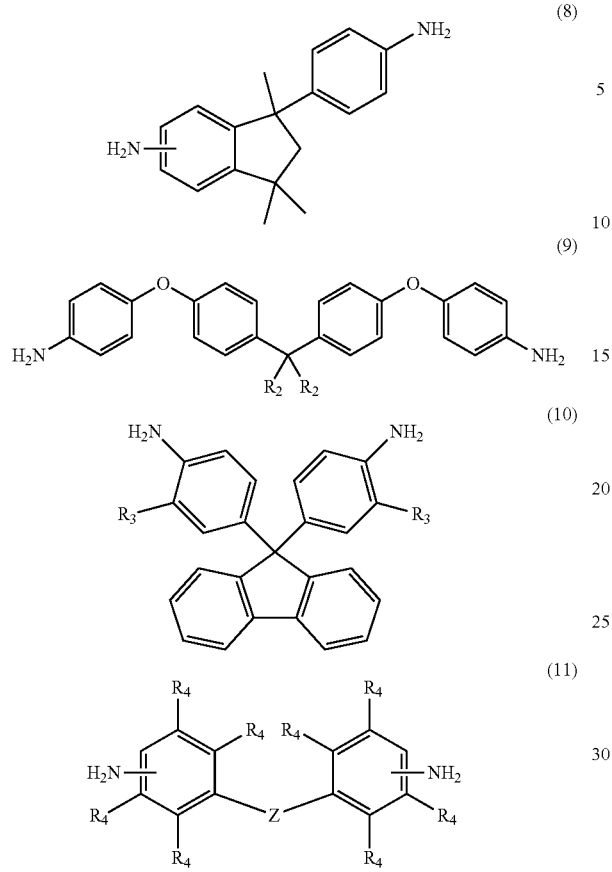

wherein in formula (9) $R_2$ independently represents a methyl group or a trifluoromethyl group, in formula (10) $R_3$ independently represents a hydrogen atom, a methyl group, or an ethyl group, in formula (11) Z represents a bivalent connection group represented by $-CH(CH_3)-, -SO_2-, -CH_2-, -O-C_6H_4-O-$ or following formula (2):

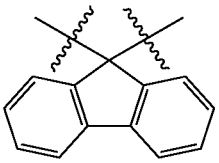

an oxygen atom, or a direct bond, $R_4$ independently represents a hydrogen atom, a methyl group, an ethyl group, or a trifluoromethyl group.

5. The polyamic acid resin according to claim 1, wherein the number of mol of MA of the amino phenol compound (a), the number of mol of MB of the aliphatic diamino compound (b), the number of mol of MC of the tetrabasic acid dianhydride (c), and the number of mol of MD of the aromatic diamino compound (d) satisfy a relationship: $1.0 < (MA+MB+MD)/MC < 1.5$.

6. A terminal-modified polyimide resin which is a reaction product of the polyimide resin according to claim 1 and maleic anhydride.

7. A resin composition comprising the polyimide resin according to claim 1 and a compound capable of reacting to an amino group and/or a maleimide group.

8. The resin composition according to claim 7, wherein the compound capable of reacting to an amino group and/or a maleimide group is a maleimide resin.

9. The resin composition according to claim 7, wherein the compound capable of reacting to an amino group and/or a maleimide group is an epoxy resin.

10. A cured product of the resin composition according to claim 7.

11. A substrate comprising the cured product according to claim 10.

* * * * *